(12) United States Patent
Wu et al.

(10) Patent No.: US 12,414,481 B2
(45) Date of Patent: Sep. 9, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventors: Jia-Rong Wu, Kaohsiung (TW); Chi-Hsuan Cheng, Kaohsiung (TW); Rai-Min Huang, Taipei (TW); Po-Kai Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 266 days.

(21) Appl. No.: 17/743,459

(22) Filed: May 13, 2022

(65) Prior Publication Data

US 2023/0337551 A1 Oct. 19, 2023

(30) Foreign Application Priority Data

Apr. 15, 2022 (CN) .......................... 202210397417.0

(51) Int. Cl.
- *H10N 52/01* (2023.01)
- *H10B 61/00* (2023.01)
- *H10N 52/00* (2023.01)
- *H10N 52/80* (2023.01)

(52) U.S. Cl.
CPC ............. *H10N 52/01* (2023.02); *H10B 61/00* (2023.02); *H10N 52/00* (2023.02); *H10N 52/80* (2023.02)

(58) Field of Classification Search
CPC ........ H10N 50/10; H10N 50/20; H10N 50/00; H10N 52/00; H10N 52/80; H10N 52/01; H10N 50/01; H10N 50/80; H10B 61/00
See application file for complete search history.

(56) References Cited

U.S. PATENT DOCUMENTS

| | | | |
|---|---|---|---|
| 10,950,656 B2 | 3/2021 | Chuang | |
| 2017/0117323 A1* | 4/2017 | Braganca | ............... H10B 61/22 |
| 2017/0271592 A1* | 9/2017 | Lee | ...................... H10N 70/063 |
| 2019/0326353 A1* | 10/2019 | O'Brien | ............. H01F 10/3254 |
| 2020/0006643 A1* | 1/2020 | Gosavi | ................... H10N 50/10 |
| 2021/0202827 A1* | 7/2021 | Song | ...................... H10N 50/01 |

* cited by examiner

*Primary Examiner* — Latanya N Crawford Eason
(74) *Attorney, Agent, or Firm* — Winston Hsu

(57) ABSTRACT

A method for fabricating semiconductor device includes the steps of first forming a magnetic tunneling junction (MTJ) on a substrate, forming a first spin orbit torque (SOT) layer on the MTJ, forming an inter-metal dielectric (IMD) layer around the first SOT layer, forming a second SOT layer on the IMD layer, forming a first hard mask on the second SOT layer, patterning the first hard mask along a first direction, and then patterning the first hard mask along a second direction.

6 Claims, 6 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for fabricating magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of first forming a magnetic tunneling junction (MTJ) on a substrate, forming a first spin orbit torque (SOT) layer on the MTJ, forming an inter-metal dielectric (IMD) layer around the first SOT layer, forming a second SOT layer on the IMD layer, forming a first hard mask on the second SOT layer, patterning the first hard mask along a first direction, and then patterning the first hard mask along a second direction.

According to another aspect of the present invention, a semiconductor device includes a magnetic tunneling junction (MTJ) on a substrate, a first spin orbit torque (SOT) layer on the MTJ, an inter-metal dielectric (IMD) layer around the first SOT layer, and a second SOT layer on the IMD layer. Preferably, a first corner of the second SOT layer includes a right angle in a top view.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
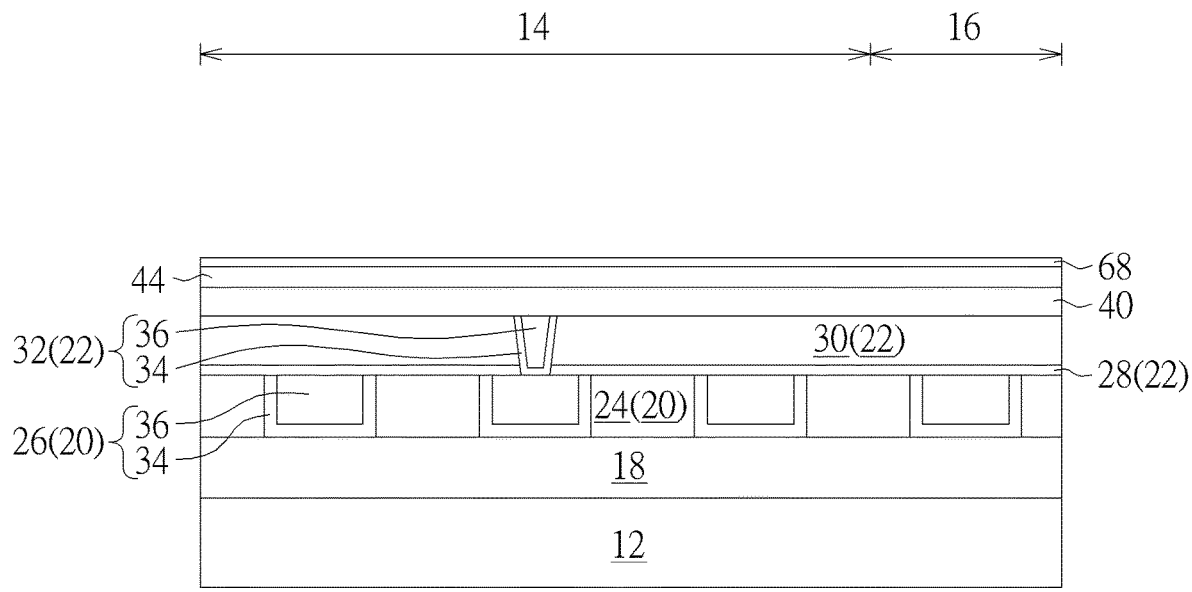
FIGS. 1-8 illustrate a method for fabricating a MRAM device according to an embodiment of the present invention.

Referring to FIGS. 1-8, FIGS. 1-8 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and an interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain regions, spacers, epitaxial layers, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 26 are preferably made of copper, the metal layer 36 in the metal interconnections 32 is made of tungsten, the IMD layers 24, 30 are preferably made of silicon oxide such as tetraethyl orthosilicate (TEOS), and the stop layer 28 is preferably made of nitrogen doped carbide (NDC), silicon nitride, silicon carbon nitride (SiCN), or combination thereof.

Next, a selective bottom electrode (not shown), a MTJ stack 40 or stack structure, a selective top electrode (not shown), a first spin orbit torque (SOT) layer 44, and a hard mask 68 are formed on the metal interconnect structure 22. In this embodiment, the formation of the MTJ stack 40 could be accomplished by sequentially depositing a pinned layer, a barrier layer, and a free layer on the bottom electrode. In this embodiment, the selective bottom electrode and top electrode could be made of conductive material including but not limited to for example Ta, Pt, Cu, Au, Al, or combination thereof. The pinned layer could be made of ferromagnetic material including but not limited to for example iron, cobalt, nickel, or alloys thereof such as cobalt-iron-boron (CoFeB) or cobalt-iron (CoFe). Alternatively, the pinned layer could also be made of antiferromagnetic (AFM) material including but not limited to for example ferromanganese (FeMn), platinum manganese (PtMn), iridium manganese (IrMn), nickel oxide (NiO), or combination thereof, in which the pinned layer is formed to fix or limit the direction of magnetic moment of adjacent layers. The barrier layer could be made of insulating material including but not limited to for example oxides such as aluminum oxide ($AlO_x$) or magnesium oxide (MgO). The free layer could be made of ferromagnetic material including but not limited to for example iron, cobalt, nickel, or alloys thereof such as cobalt-iron-boron (CoFeB), in which the magnetized direction of the free layer could be altered freely depending on the influence of outside magnetic field. Preferably, the first SOT layer 44 is serving as a channel for the MRAM device as the first SOT layer 44 could include metals such as tantalum (Ta), tungsten (W), platinum (Pt), or hafnium (Hf) and/or topological insulator such as bismuth selenide ($Bi_xSe_{1-x}$). The hard mask 68 preferably includes conductive material or metal such as ruthenium (Ru), but not limited thereto.

Figure 2:
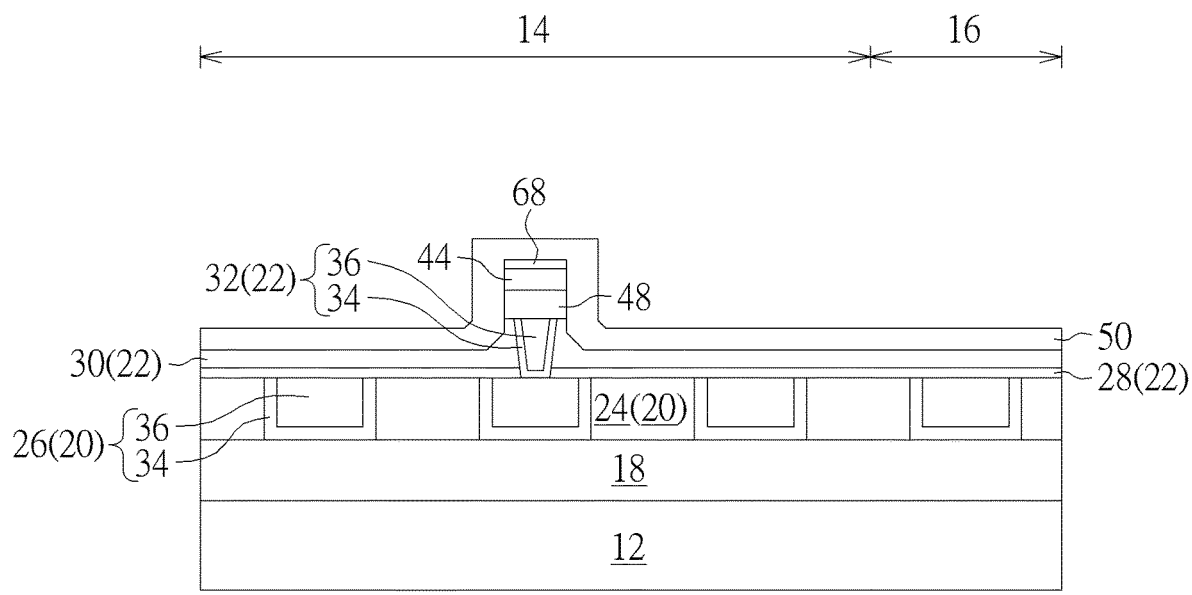

Next, as shown in FIG. 2, one or more etching process could be conducted to by using a patterned mask (not shown) as mask to remove part of the hard mask 68, part of the first SOT layer 44, part of the MTJ stack 40, and part of the IMD layer 30 to form a MTJ 48 on the MRAM region 14, and the patterned mask is removed thereafter. It should be noted that a reactive ion etching (RIE) process or an ion beam etching (IBE) process could be conducted at this stage to remove the MTJ stack 40 and the IMD layer 30 in this embodiment for forming the MTJ 48. Due to the characteristics of the IBE process, the top surface of the remaining IMD layer 30 is slightly lower than the top surface of the metal interconnections 32 after the IBE process and the top surface of the IMD layer 30 also reveals a curve or an arc. It should also be noted that as the IBE process is conducted to remove part of the IMD layer 30, part of the metal interconnection 32 could be removed at the same time to form inclined sidewalls on the surface of the metal interconnection 32 immediately adjacent to the MTJ 48.

Next, a cap layer 50 is formed on the MTJ 48 while covering the surface of the IMD layer 30 on the MRAM region 14 and the logic region 16. In this embodiment, the cap layer 50 preferably includes silicon nitride, but could also include other dielectric material including but not limited to for example silicon oxide, silicon oxynitride (SiON), or silicon carbon nitride (SiCN).

Figure 3:
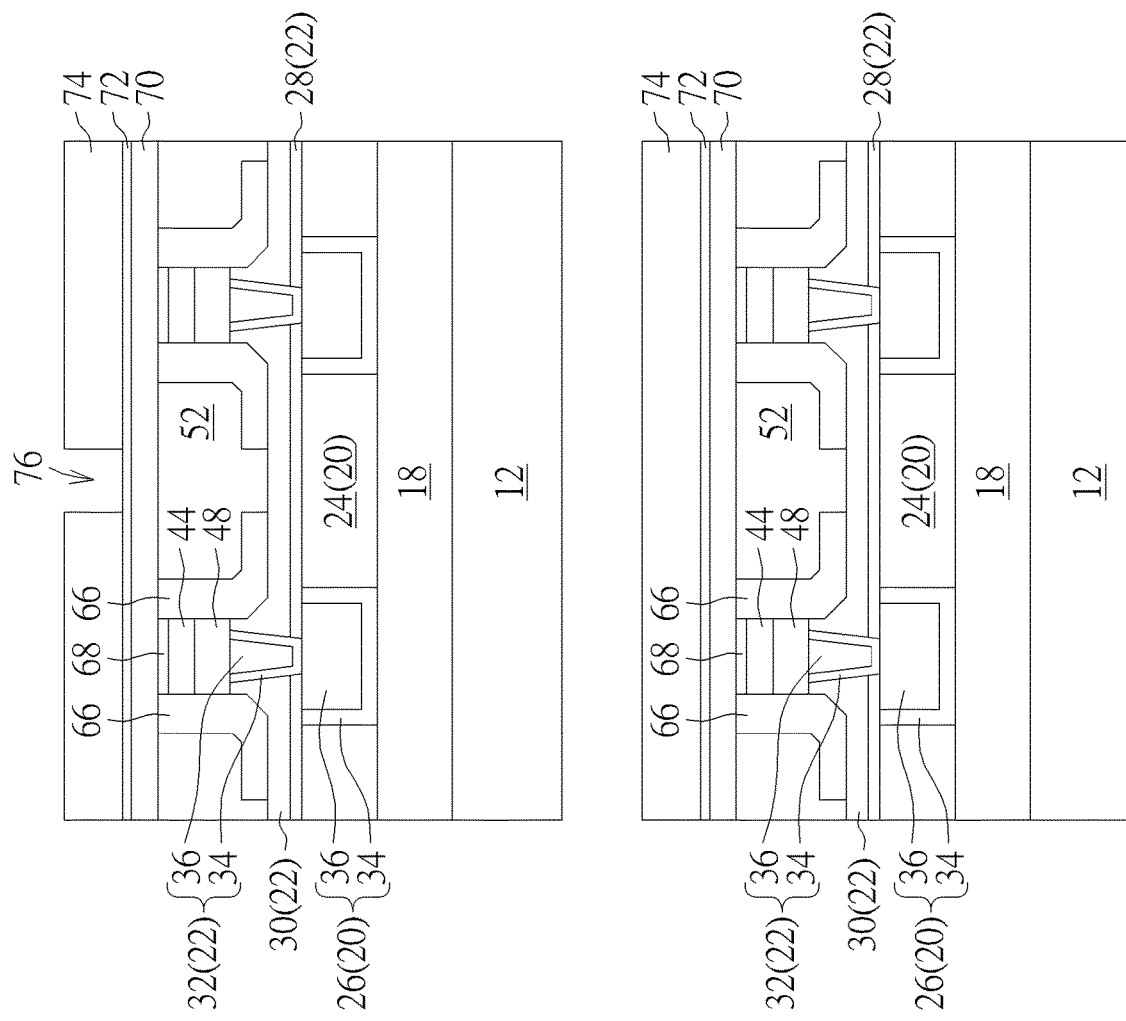
Figure 3:
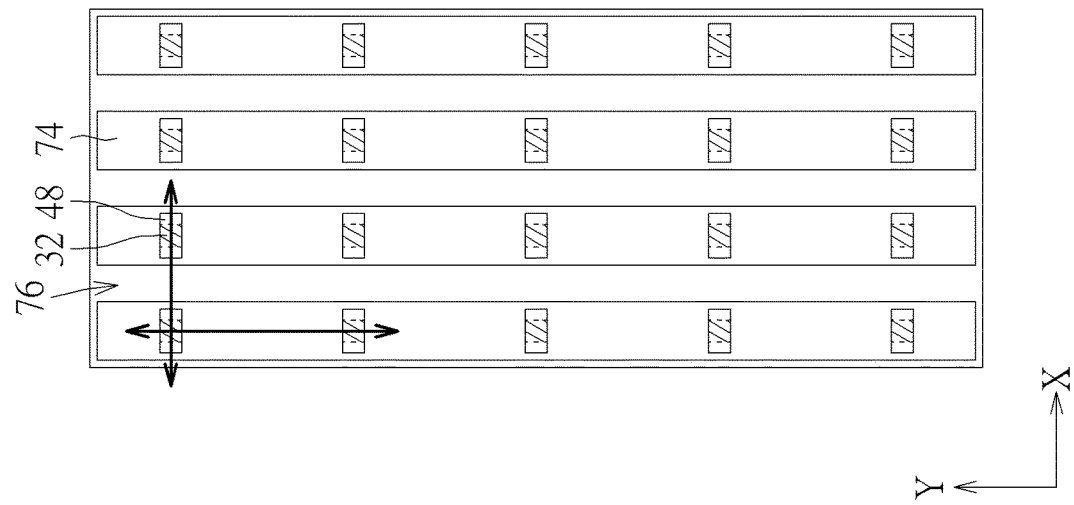

Referring to FIG. 3, the left portion of FIG. 3 illustrates a top view for fabricating the MRAM device in the MRAM region 14 following FIG. 2, the top right portion of FIG. 3 illustrates a cross-section view for fabricating the MRAM device taken along the X-direction arrow from the left portion, and the bottom right portion of FIG. 3 illustrates a cross-section view for fabricating the MRAM device taken along the Y-direction arrow from the left portion. As shown in FIG. 3, it would be desirable to first follow the processes conducted in FIGS. 1-2 by forming an array made of a plurality of MTJs 48 on the MRAM region 14 and then conduct an etching process with or without using a patterned mask such as patterned resist to remove part of the cap layer 50 for forming a spacer 66 on sidewalls of the MTJ 48, the first SOT layer 44, and the hard mask 68, in which the spacer 66 has a substantially L-shape cross-section. Next, a deposition process such as an atomic layer deposition (ALD) process is conducted to form an inter-metal dielectric (IMD) layer 52 on the hard mask 68, the spacer 66, and the IMD layer 30, and a planarizing process such as chemical mechanical polishing (CMP) process or etching back process is conducted to remove part of the IMD layer 52 so that the top surface of the remaining IMD layer 52 is even with the top surface of the spacer 66 and hard mask 68.

Next, a second SOT layer 70, a hard mask 72, and another hard mask 74 are formed on the IMD layer 52 to cover the hard mask 68 and spacer 66. In this embodiment, the second SOT layer 70 preferably includes metal nitride such as TiN, the hard mask 72 includes metal such as Ta, and the hard mask 74 includes conductive or dielectric material such as TiN or silicon oxide, but not limited thereto. It should be noted that the second SOT layer 70 could also be serving as a channel for the MRAM device as the second SOT layer 70 and the first SOT layer 44 could be made of same or different material. For instance, even though the second SOT layer 70 preferably includes TiN in this embodiment, the second SOT layer 70 could also include tantalum (Ta), tungsten (W), platinum (Pt), or hafnium (Hf) and/or topological insulator such as bismuth selenide ($Bi_xSe_{1-x}$).

Next, a photo-etching process could be conducted by using a patterned mask (not shown) such as patterned resist as mask to remove part of the hard mask 74 for forming an opening 76 exposing the top surface of the hard mask 74. It should be noted that the etching process conducted at this stage is preferably carried out along a first direction such as Y-direction to pattern or remove part of the hard mask 74 so that the opening 76 formed according to the top right portion of FIG. 3 is preferably extending along the Y-direction in the patterned hard mask 74 and exposing the top surface of the hard mask 72.

Figure 4:
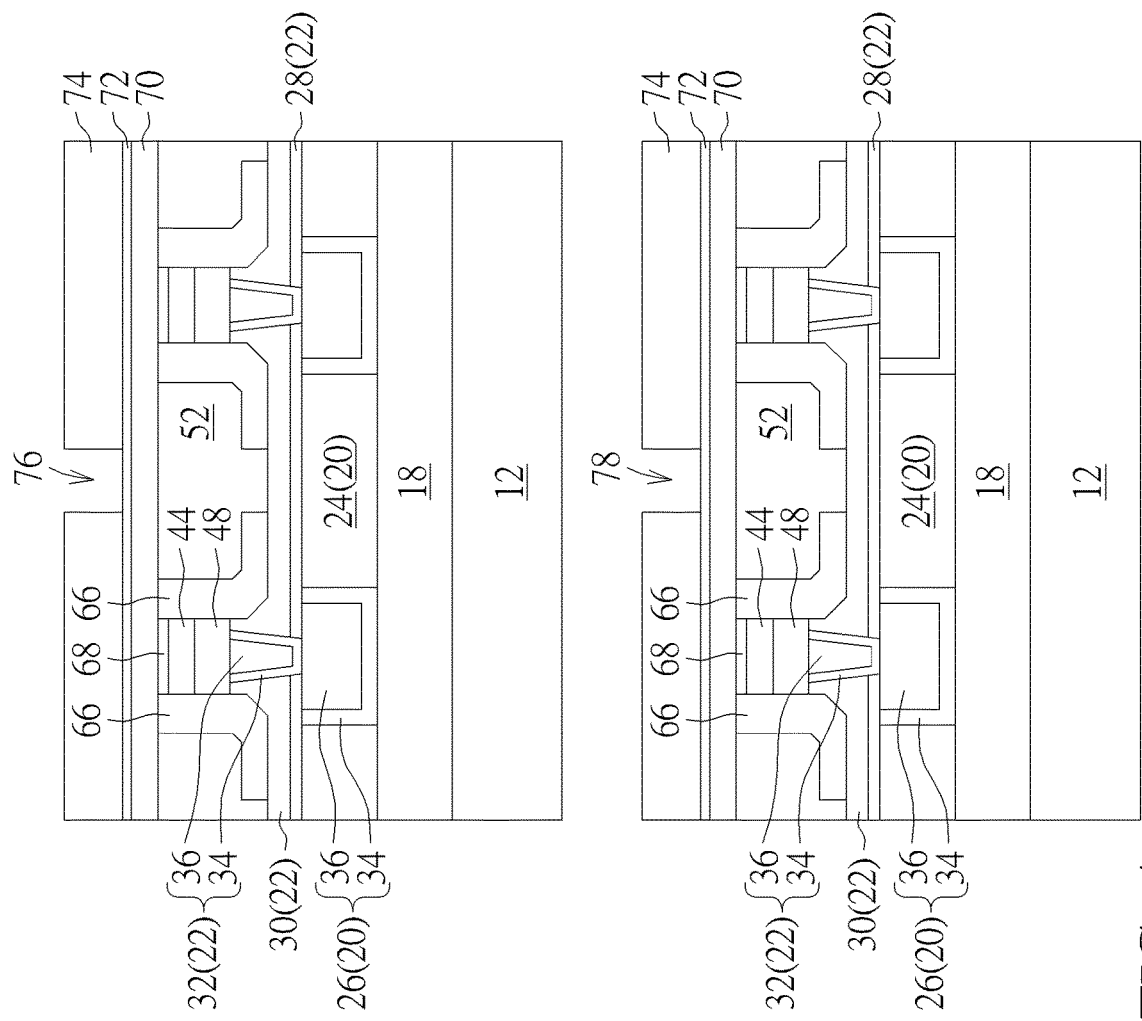
Figure 4:
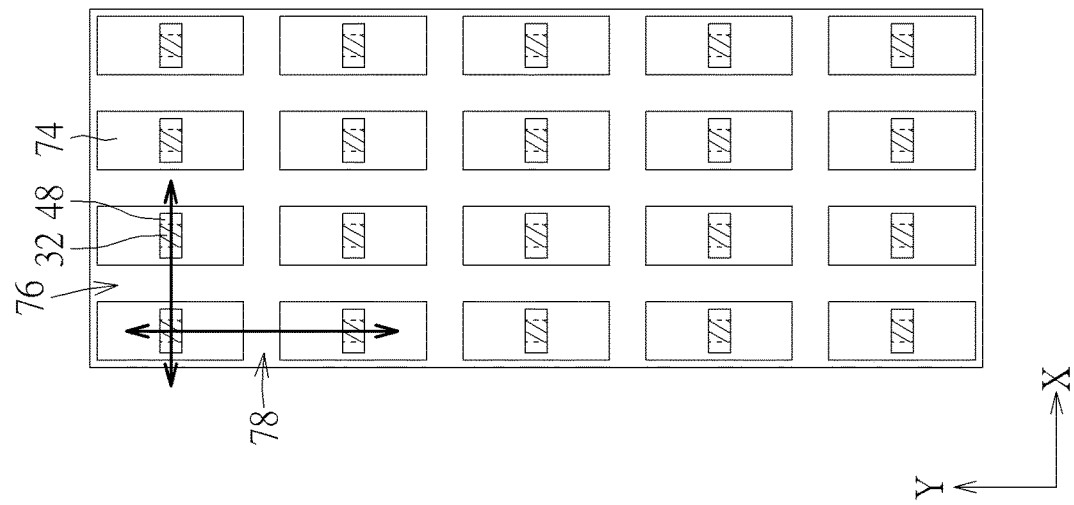

Referring to FIG. 4, the left portion of FIG. 4 illustrates a top view for fabricating the MRAM device in the MRAM region 14 following FIG. 3, the top right portion of FIG. 4 illustrates a cross-section view for fabricating the MRAM device taken along the X-direction arrow from the left portion, and the bottom right portion of FIG. 4 illustrates a cross-section view for fabricating the MRAM device taken along the Y-direction arrow from the left portion. As shown in FIG. 4, another photo-etching process could be conducted by using another patterned mask (not shown) such as patterned resist as mask to remove part of the hard mask 74 once more for forming an opening 78 exposing the top surface of the hard mask 72. In contrast to the aforementioned photo-etching process conducted along the Y-direction for patterning the hard mask 74, the photo-etching process conducted at this stage is carried out along a second direction such as an X-direction perpendicular to the first direction so that the opening 78 shown in the bottom right portion of FIG. 4 is therefore formed extending along the X-direction in the patterned hard mask 74 and exposing the top surface of the hard mask 72. The opening 76 shown on the top right portion of FIG. 4 on the other hand is still extending along the Y-direction and exposing the top surface of the hard mask 72. As shown in the left portion of FIG. 4 taken along the top view perspective, the hard mask 74 after being patterned by two photo-etching processes along two different directions is now divided into a plurality of rectangles or rectangular blocks not contacting each other directly instead of rectangular strips extending along the Y-direction shown in previous figures.

Figure 5:
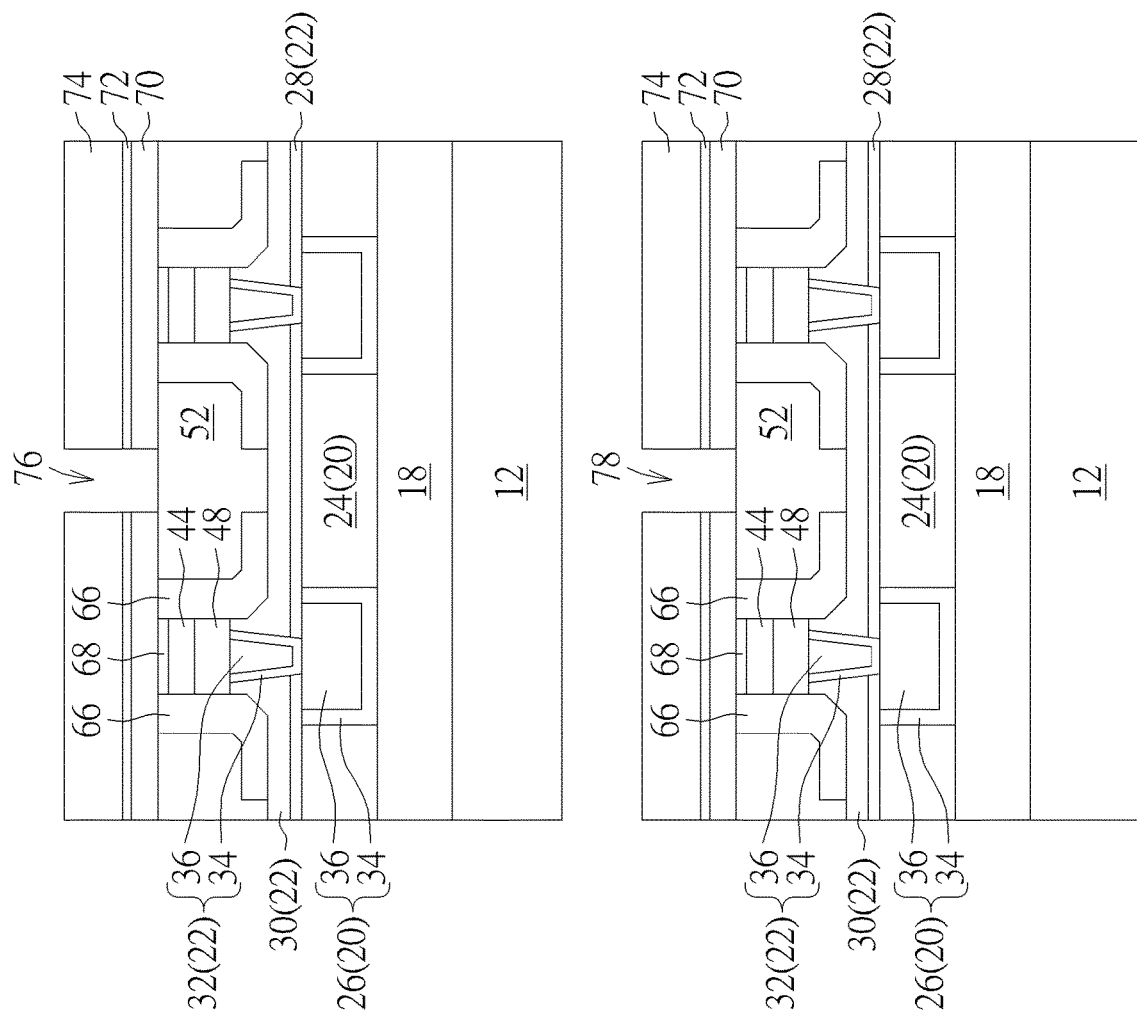
Figure 5:
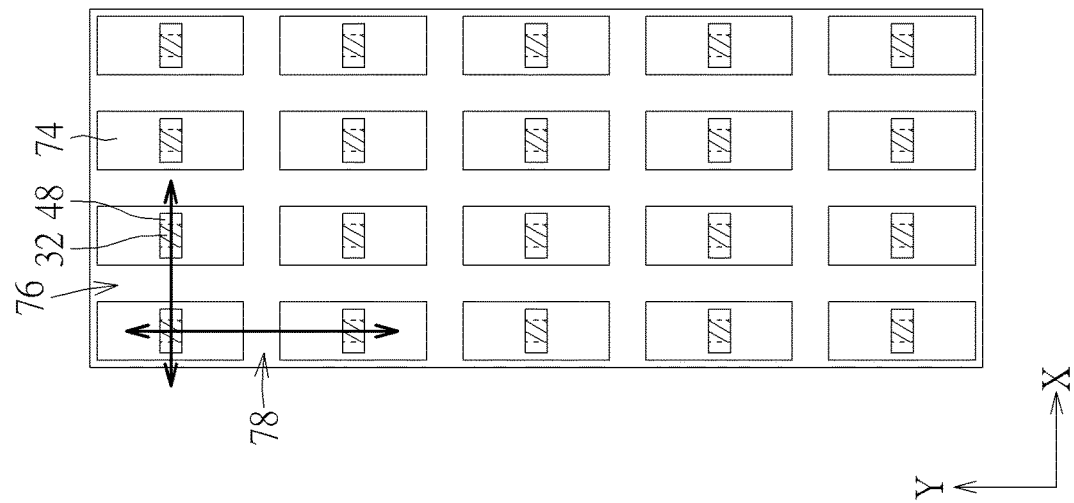

Referring to FIG. 5, the left portion of FIG. 5 illustrates a top view for fabricating the MRAM device in the MRAM region 14 following FIG. 4, the top right portion of FIG. 5 illustrates a cross-section view for fabricating the MRAM device taken along the X-direction arrow from the left portion, and the bottom right portion of FIG. 5 illustrates a cross-section view for fabricating the MRAM device taken along the Y-direction arrow from the left portion. As shown in FIG. 5, another photo-etching process is then conducted by using the patterned hard mask 74 as mask to remove part of the hard mask 72 and part of the second SOT layer 70 through the openings 76 and 78 formed previously and then expose the top surface of the IMD layer 52. It should be noted that at this stage the pattern of the hard mask 74 is preferably transferred to the hard mask 72 and second SOT layer 70 underneath so that the hard mask 72 and second SOT layer 70 now include same pattern as the hard mask 74 if viewed under a top view perspective.

Figure 6:
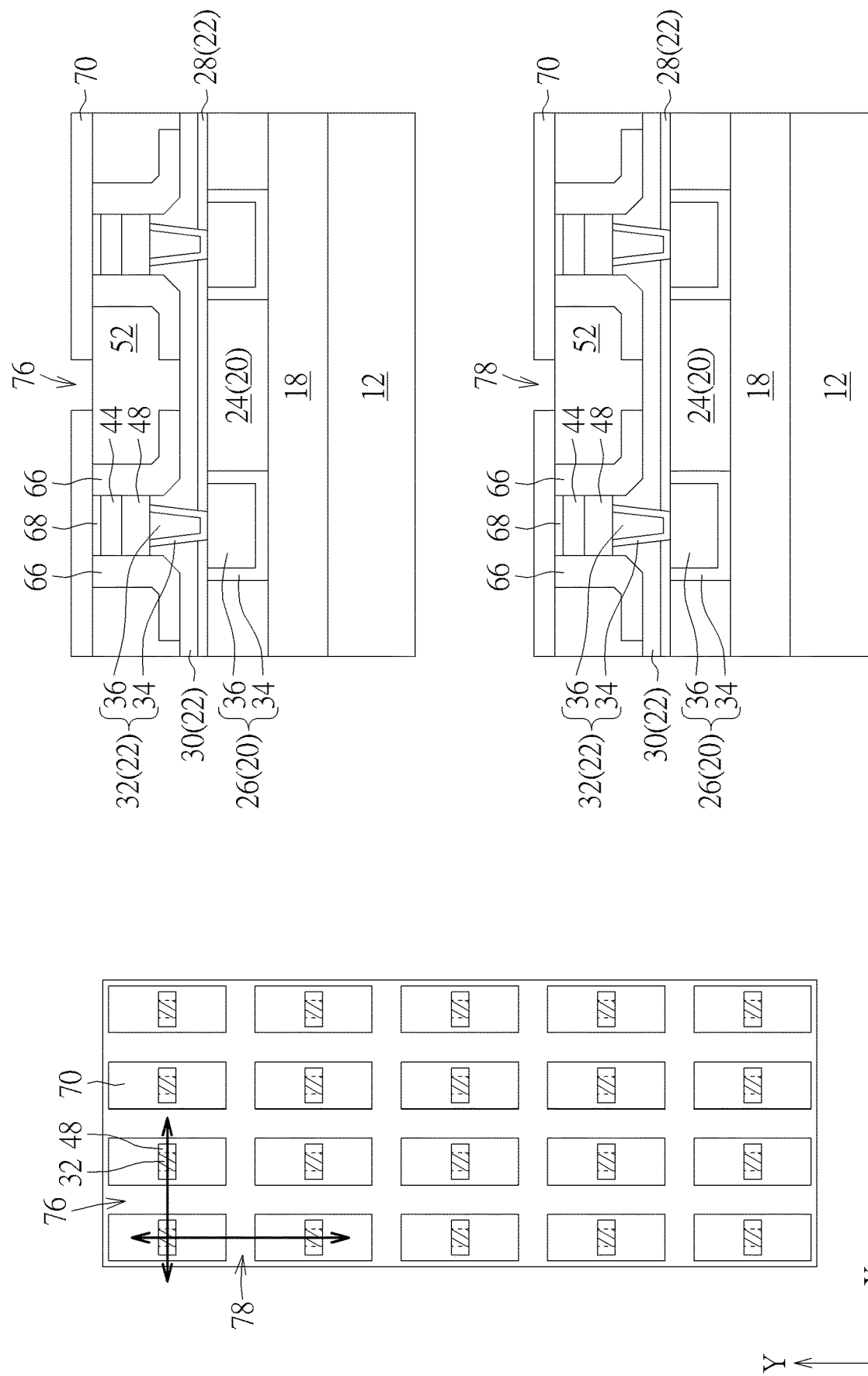

Referring to FIG. 6, the left portion of FIG. 6 illustrates a top view for fabricating the MRAM device in the MRAM region 14 following FIG. 5, the top right portion of FIG. 6 illustrates a cross-section view for fabricating the MRAM device taken along the X-direction arrow from the left portion, and the bottom right portion of FIG. 6 illustrates a cross-section view for fabricating the MRAM device taken along the Y-direction arrow from the left portion. As shown in FIG. 6, one or more etching process could be conducted to remove the hard mask 74 and hard mask 72 to expose the top surface of the second SOT layer 70. As shown in the left portion of FIG. 6, after being patterned by two photo-etching process in both X-direction and Y-direction, the second SOT layer 70 viewed under the top view perspective preferably includes a plurality of rectangles or rectangular blocks, in which each of the four corners of the second SOT layer 70 includes a right angle or more specifically a 90 degrees included angle.

Figure 7:
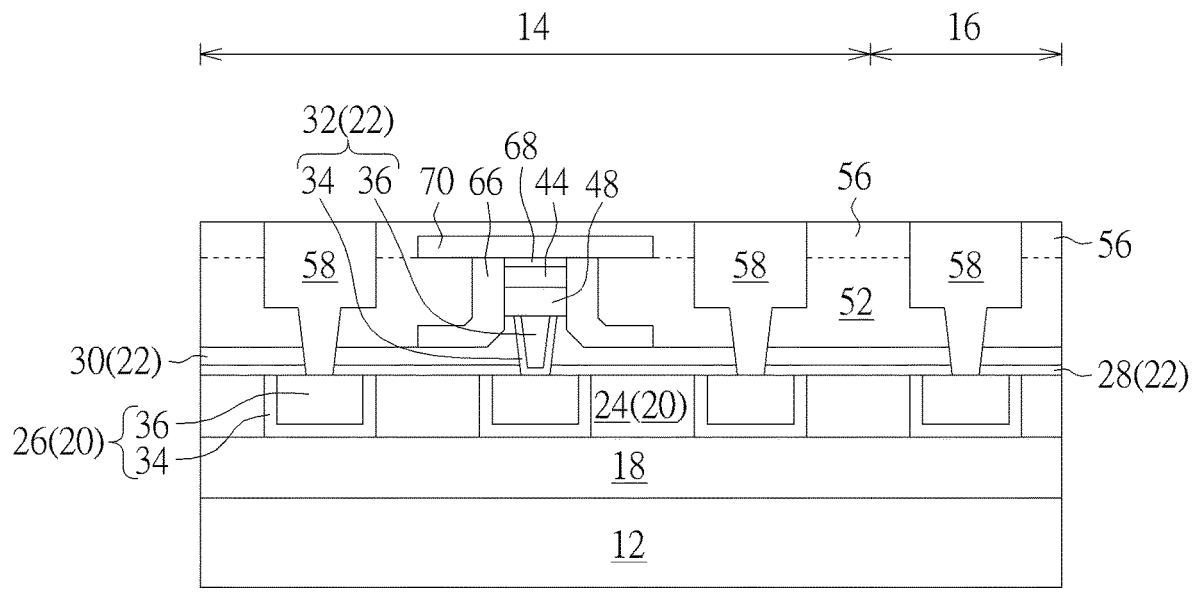

Next, as shown in FIG. 7, another IMD layer 56 is formed on the second SOT layer 70 and the IMD layer 52. In this embodiment, each of the IMD layer 52 and IMD layer 56 preferably includes an ultra low-k (ULK) dielectric layer including but not limited to for example porous material or silicon oxycarbide (SiOC) or carbon doped silicon oxide (SiOCH). Next, a planarizing process such as chemical mechanical polishing (CMP) process or etching back process is conducted to remove part of the IMD layer 56 while the top surface of the remaining IMD layer 56 is still higher than the top surface of the second SOT layer 70.

Next, a pattern transfer process is conducted by using a patterned mask (not shown) to remove part of the IMD layer 56, part of the IMD layer 52, part of the IMD layer 30, and part of the stop layer 28 on the MRAM region 14 and logic region 16 to form contact holes (not shown) exposing the metal interconnections 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the conductive materials including the aforementioned barrier layer and metal layer to form metal interconnections 58 in the contact holes electrically connecting the metal interconnections 26.

Figure 8:
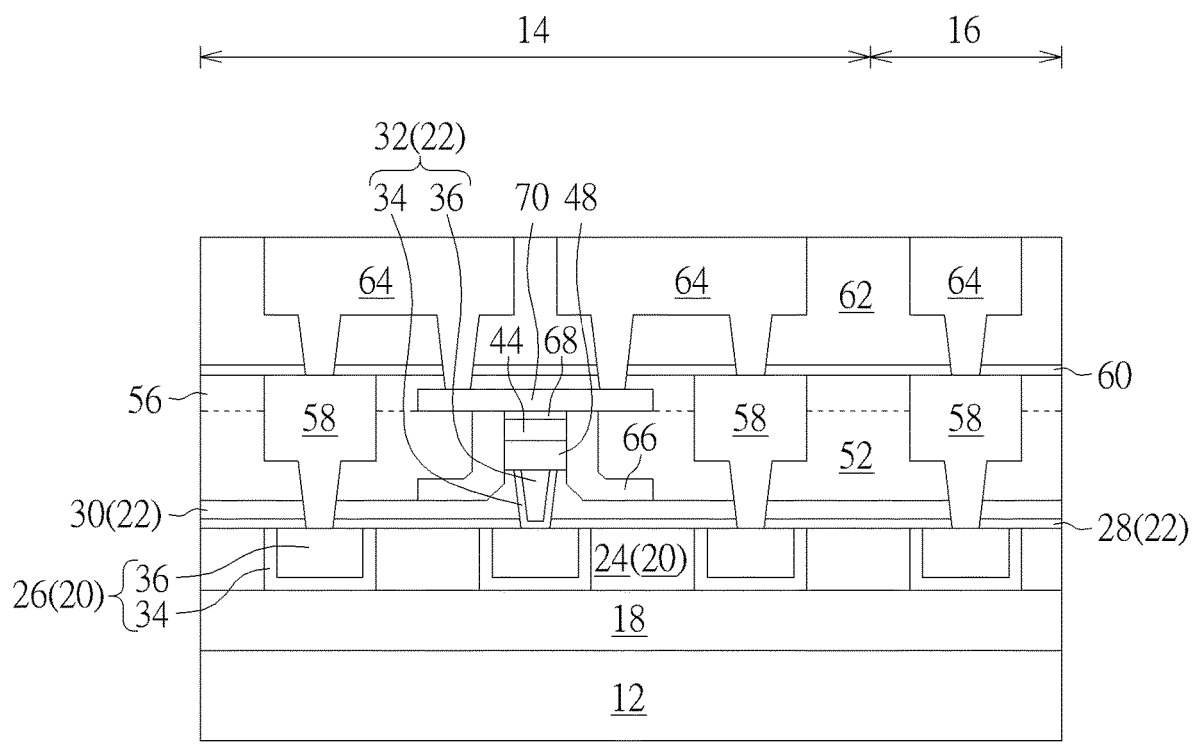

Next, as shown in FIG. 8, a stop layer 60 is formed on the MRAM region 14 and logic region 16 to cover the IMD layer 56 and metal interconnections 58, an IMD layer 62 is formed on the stop layer 60, and one or more photo-etching process is conducted to remove part of the IMD layer 62, part of the stop layer 60, and part of the IMD layer 56 on the MRAM region 14 and logic region 16 to form contact holes (not shown). Next, conductive materials are deposited into each of the contact holes and a planarizing process such as CMP is conducted to form metal interconnections 64 connecting the MTJ 48 and metal interconnections 58 underneath, in which the metal interconnections 64 on the MRAM region 14 directly contacts the second SOT layer 70 underneath while the metal interconnections 64 on the logic region 16 directly contacts the metal interconnections 58 on the lower level.

In this embodiment, the stop layers 60 and 28 could be made of same or different materials, in which the two layers 60, 28 could all include nitrogen doped carbide (NDC), silicon nitride, silicon carbon nitride (SiCN), or combination thereof. Similar to the metal interconnections formed previously, each of the metal interconnections 64 could be formed in the IMD layer 62 through a single damascene or dual damascene process. For instance, each of the metal interconnections 64 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   forming a magnetic tunneling junction (MTJ) on a substrate;
   forming a first spin orbit torque (SOT) layer on the MTJ;
   forming an inter-metal dielectric (IMD) layer around the first SOT layer;
   forming a second SOT layer on the IMD layer;
   forming a first hard mask on the second SOT layer;
   forming a third hard mask on the second SOT layer;
   patterning the first hard mask along a first direction for forming a first opening;
   patterning the first hard mask along a second direction after patterning the first hard mask along the first direction for forming a second opening; and etching the third hard mask and the second SOT layer through the first opening and the second opening.

2. The method of claim 1, further comprising:
forming a second hard mask on the first SOT layer;
forming a spacer adjacent to the first SOT layer;
forming the IMD layer around the spacer; and
forming the second SOT layer on the first SOT layer, the spacer, and the IMD layer.

3. The method of claim 2, wherein the second hard mask comprises ruthenium (Ru).

4. The method of claim 2, wherein the third hard mask comprises metal.

5. The method of claim 2, wherein the top surfaces of the second hard mask and the IMD layer are coplanar.

6. The method of claim 1, wherein the first direction is orthogonal to the second direction.

* * * * *